(12) United States Patent
Okamori

(10) Patent No.: US 8,304,656 B2
(45) Date of Patent: Nov. 6, 2012

(54) LINE PATTERN FORMATION METHOD

(75) Inventor: Kazuaki Okamori, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 372 days.

(21) Appl. No.: 12/659,292

(22) Filed: Mar. 3, 2010

(65) Prior Publication Data

US 2010/0224392 A1 Sep. 9, 2010

(30) Foreign Application Priority Data

Mar. 9, 2009 (JP) ................................. 2009-054514
Dec. 17, 2009 (JP) ................................. 2009-286077

(51) Int. Cl.
 *H05K 1/00* (2006.01)
(52) U.S. Cl. ...................................................... 174/250
(58) Field of Classification Search .................. 174/250; 349/155; 347/5, 9, 12, 15
See application file for complete search history.

(56) References Cited

U.S. PATENT DOCUMENTS 6,501,527 B1 * 12/2002 Hirose et al. .................. 349/155
2005/0001866 A1 * 1/2005 Eguchi et al. .................. 347/15

FOREIGN PATENT DOCUMENTS

JP 2003-318516 11/2003
JP 2004-016916 1/2004

* cited by examiner

*Primary Examiner* — Jeremy Norris
*Assistant Examiner* — Tremesha S Willis
(74) *Attorney, Agent, or Firm* — Jean C. Edwards, Esq.; Edwards Neils PLLC

(57) ABSTRACT

A line pattern is formed on a substrate by performing a first step and a second step. In the first step, a liquid material containing a pattern formation material dispersed or dissolved therein is dropped onto the substrate and dried. In the second step, the liquid material is dropped onto a dried body that has been obtained by drying the liquid material in the first step. In the second step, the liquid material is dropped at a smaller ejection amount than that of the first step. Further, the pitch of dropping the liquid material onto the substrate in the first step and the pitch of dropping the liquid material onto the dried body in the second step are less than or equal to a jaggy generation limit.

10 Claims, 4 Drawing Sheets

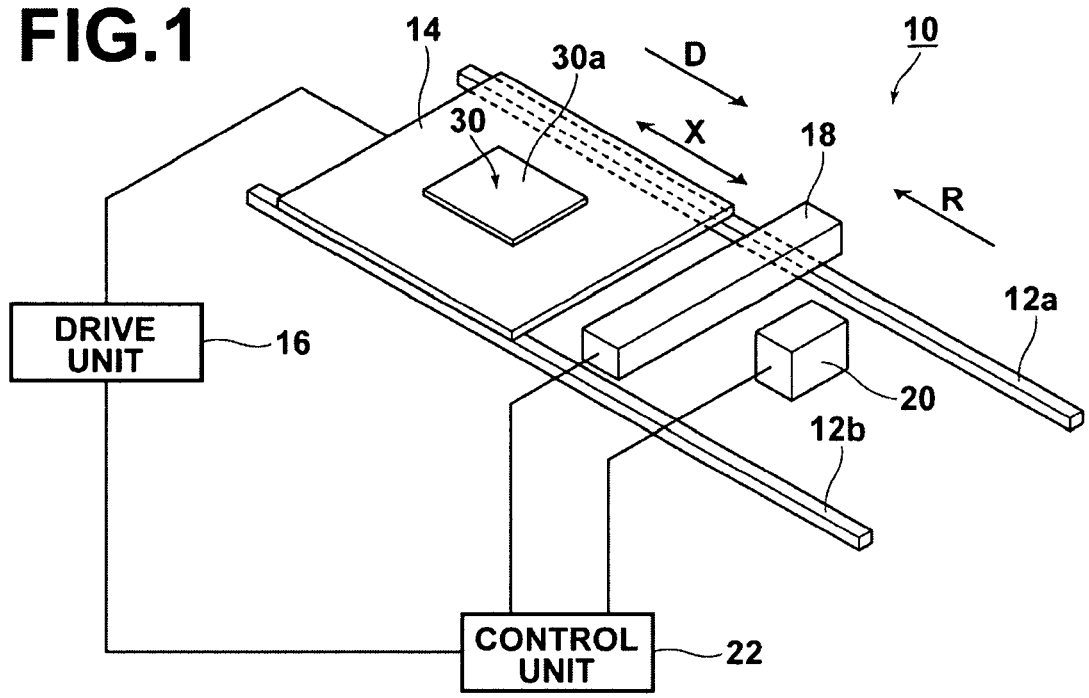
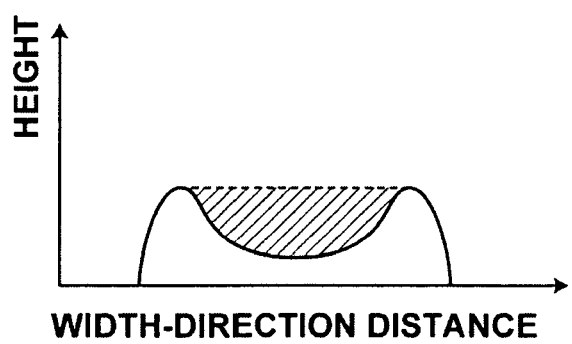

LINE PATTERN FORMATION METHOD

CROSS-REFERENCE TO RELATED APPLICATIONS

The present application claims priority from Japanese Patent Application No. 2009-054514, filed Mar. 9, 2009, and Japanese Patent Application No. 2009-286077, filed Dec. 17, 2009, the contents of all of which are herein incorporated by reference in their entirety.

BACKGROUND OF THE INVENTION

1. Field of the Invention

The present invention relates to a line pattern formation method using a liquid material containing a pattern formation material dispersed or dissolved therein, a device and an electronic apparatus (electronic machine).

2. Description of the Related Art

Conventionally, techniques, such as a photolithography method, a transfer method, a mask printing method, and a plating method, were used to produce circuit patterns of printed circuit boards. In recent years, attention was given to a technique for directly printing a pattern on a substrate using an electronically-conductive microparticle paste, which contains electronically conductive microparticles dispersed therein, by using an inkjet method.

However, ink that is used in the inkjet method has low viscosity so that the ink can be ejected, and such ink tends to spread widely. Therefore, it has been difficult to draw a thin circuit pattern by using the inkjet method. Further, in the inkjet method, a so-called coffee stain effect occurs because the speed of evaporation of liquid at a rim portion of the liquid and the speed of evaporation of the liquid at a central portion of the liquid are not the same. Particles accumulate in the rim portion, and there is a problem that when the ink dries, the thickness of the layer in the rim portion and the thickness of the layer in the central portion are not the same. Therefore, a layer formation method for preventing the thickness of the layer from becoming uneven has been proposed (please refer to Japanese Unexamined Patent Publication No. 2003-318516).

The method disclosed in Japanese Unexamined Patent Publication No. 2003-318516 includes a first ejection step for forming a line pattern by dropping liquid droplets of a liquid material containing a layer formation component therein onto a substrate, a drying step for drying the line pattern, and a second ejection step for dropping liquid droplets onto a depression on a dried body that has been formed on the substrate in the drying step. As described above, in the method disclosed in Japanese Unexamined Patent Publication No. 2003-318516, the drying step that promotes the coffee stain effect is provided after a line pattern is formed in the first ejection step to intentionally generate a height difference (a difference between a thick portion and a thin portion) in the dried body. Consequently, a depression is formed on the dried body. Further, in the second ejection step, liquid droplets are further dropped into the depression. Accordingly, it is possible to make the thickness of the line pattern even.

Meanwhile, when a coating (coating layer) is formed by using an inkjet method, a method for forming a flat coating is proposed (please refer to Japanese Unexamined Patent Publication No. 2004-016916). In the method, after a coating is formed in a first ejection step, a certain amount of liquid that can fill a depression formed in the coating is dropped into the depression in a second ejection step to form a flat coating (please refer to Japanese Unexamined Patent Publication No. 2004-016916).

However, in the method disclosed in Japanese Unexamined Patent Publication No. 2003-318516, when the depression formed in the dried body by the first ejection step and the drying step is small, if droplets of liquid are dropped at an appropriate dot pitch for forming a line pattern in the second ejection step, the volume of the dropped droplets of liquid is greater than the volume of the depression. Therefore, when the droplets of liquid dropped into the depression in the dried body dry, a line pattern having a projected cross-section is formed. In this case, the ejection pitch in the second ejection step may be set longer than an appropriate ejection pitch for forming the line pattern so that the droplets of liquid are less densely ejected. However, when the droplets of liquid are less densely ejected, jaggies are generated, and an even line pattern is not formed. Further, when the formed line pattern does not have an even thickness, the risk of disconnection of circuits by unevenness in the density of electric current increases in the formed line pattern.

Meanwhile, in the method disclosed in Japanese Unexamined Patent Publication No. 2004-016916, in formation of the coating, the amount of the droplets of liquid ejected in the second ejection step is controlled so that the depression in the coating formed in the first ejection step is filled. Therefore, it is impossible to apply the method disclosed in Japanese Unexamined Patent Publication No. 2004-16916 to formation a line pattern.

SUMMARY OF THE INVENTION

In view of the foregoing circumstances, it is an object of the present invention to form a line pattern having cross-sectional form with small width and even thickness.

A line pattern formation method of the present invention is a line pattern formation method comprising:

first step in which a liquid material containing a pattern formation material dispersed or dissolved therein is dropped onto a substrate and dried; and second step in which the liquid material is dropped onto a dried body that has been obtained by drying the liquid material in the first step, wherein in the second step, the liquid material is dropped at a smaller ejection amount than that of the first step, and wherein the pitch of dropping the liquid material onto the substrate in the first step and the pitch of dropping the liquid material onto the dried body in the second step are less than or equal to a jaggy generation limit.

In the line pattern formation method of the present invention, the ejection amount of the liquid material in the second step may be determined based on the area of a cross section of a depression formed on the dried body.

In the line pattern formation method of the present invention, the liquid material dropped onto the substrate in the first step may be forcedly dried.

Further, in the line pattern formation method of the present invention, drying of the liquid material that has been dropped onto the dried body in the second step may be suppressed.

In the line pattern formation method of the present invention, the liquid material may be ejected by the same ejection means in the first and second steps. Alternatively, the liquid material may be ejected by a different ejection means in each of the first and second steps.

In the line pattern formation method of the present invention, the liquid material may be ejected by an ejection means of inkjet type or dispenser type.

In the line pattern formation method of the present invention, the pattern formation material may be microparticles of a metal, microparticles of an oxide of the metal, or microparticles of an alloy of the metal.

In such a case, the metal may be gold, silver, copper, platinum, nickel, palladium or tin.

A device of the present invention is a device comprising:

a portion formed by using the line pattern formation method of the present invention. The portion is, for example, a circuit pattern.

Further, an electronic apparatus of the present invention is an electronic apparatus comprising:

the device of the present invention.

According to the line pattern formation method of the present invention, the ejection amount of the liquid material in the second ejection step is smaller than the ejection amount of the liquid material in the first step. Therefore, it is possible to form a line pattern having cross-sectional form with small width and even height (in other words, which is thin (narrow) and flat). Further, the pitch of dropping the liquid material onto the substrate in the first step and the pitch of dropping the liquid material onto the dried body in the second step are less than or equal to a jaggy generation limit. Therefore, when a circuit pattern is formed by using the present invention, high density wiring (circuit) is possible. Further, since the thickness of the circuit pattern is even, the density of the electric current becomes even, and the risk of disconnection of circuits is reduced.

Further, when the ejection amount of the liquid material in the second step is determined based on the area of the cross section of the depression formed on the dried body, it is possible to determine the ejection amount for the second step in such a manner that the upper surface of the pattern becomes even (flat). Hence, it is possible to form a pattern having cross-sectional form with more even thickness.

When the liquid material dropped onto the substrate is forcedly dried in the first step, the coffee stain effect is promoted. Therefore, it is possible to more certainly form a depression in the dried body (in other words, it is possible to surely make the cross-section of the dried body depressed (or U-shaped)).

Further, when drying of the liquid material that has been dropped onto the dried body in the second step is suppressed, the coffee stain effect is suppressed. Consequently, when the liquid material dropped in the second step dries, the possibility that a depression is formed in the cross-section of the dried liquid material is reduced. Therefore, it is possible to form a line pattern having a cross-section in which the depression in the dried body formed in the first step is filled. Hence, it is possible to more certainly form a line pattern that has a cross-section having an even thickness.

Further, the device of the present invention can reduce the size and the thickness of the device. Further, the risk of a failure, such as a disconnection of circuits and a short circuit, is reduced.

Further, the electronic apparatus of the present invention can reduce the size and the thickness of the electronic apparatus. Further, the risk of a failure, such as a disconnection of circuits and a short circuit, is reduced.

BRIEF DESCRIPTION OF THE DRAWINGS

FIG. 1 is a schematic diagram illustrating a perspective view showing the structure of a line pattern formation apparatus used in a line pattern formation method according to a first embodiment of the present invention;

FIG. 2 is a diagram illustrating the cross-sectional form of a dried body formed on a substrate in a first step;

DESCRIPTION OF THE PREFERRED EMBODIMENTS

Figure 3:
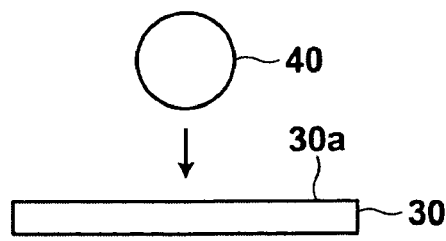
FIG. 3 is a diagram illustrating a step of the line pattern formation method according to the first embodiment of the present invention (No. 1)

Hereinafter, embodiments of the present invention will be described with reference to drawings. In the present invention, a line pattern is formed on a substrate by performing first step in which a liquid material containing a line pattern formation material dispersed or dissolved therein is dropped onto a substrate and dried, and second step in which the liquid material is dropped, at an ejection amount that is smaller than the ejection amount of the liquid material in the first step, onto a dried body that has been obtained by drying the liquid material in the first step.

FIG. 1 is a schematic diagram illustrating a perspective view showing the structure of a line pattern formation apparatus used in a line pattern formation method according to a first embodiment of the present invention. As illustrated in FIG. 1, a line pattern formation apparatus 10 according to the first embodiment includes a pair of guides 12a, 12b, a stage 14, a drive unit 16, an ejection unit (ejection means) 18, a measurement unit 20, and a control unit 22.

The control unit 22 is connected to the ejection unit 18, the drive unit 16 and the measurement unit 20, and controls drive of these units.

In the line pattern formation apparatus 10, longitudinal guides 12a, 12b are arranged with a predetermined space therebetween. For example, linear motion guides are used as the guides 12a, 12b. Further, the stage 14 is provided on the guides 12a, 12b in such a manner that the stage 14 is movable in the longitudinal direction of the guides 12a, 12b (hereinafter, referred to as direction X). A substrate 30 on which a line pattern is to be formed is placed on the stage 14.

Further, a moving mechanism (not illustrated) that is movable in direction X is provided for the stage 14. The moving mechanism is moved by an instruction from the drive unit 16.

When the drive unit 16 controlled by the control unit 22 instructs the moving mechanism, the stage 14 moves in direction X. The structure of the drive unit 16 is not particularly limited as long as the drive unit 16 can move the stage 14 on the guides 12a, 12b.

In the present embodiment, a liquid material is dropped from the ejection unit 18, provided above the guides 12a, 12b, onto a surface 30a of the substrate 30, as described later. The liquid material is dropped in predetermined line pattern form. Therefore, the drive unit 16 has a movement resolution that is sufficient to form the line pattern.

The ejection unit 18 drops the liquid material containing the pattern formation material dispersed or dissolved therein onto the surface 30a of the substrate 30 in such a manner to form a predetermined line pattern. Further, a positioning means (not illustrated) that can adjust the position at which the liquid is dropped is provided for the ejection unit 18.

The structure of the ejection unit 18 is not particularly limited as long as the ejection unit 18 can eject the liquid material containing the pattern formation material dispersed or dissolved therein. Optionally, an inkjet head may be used as the ejection unit 18. When the inkjet head is used, it is possible to accurately control the ejection amount of the liquid material, the frequency of ejection of the liquid material, and the position onto which the liquid material is deposited. Further, various kinds of inkjet heads, such as a piezoelectric-type inkjet head, a thermal-type inkjet head, an electrostatic-actuator-type inkjet head and an electrostatic-absorption-type inkjet head, may be used.

The ejection unit 18 may be a dispenser. Since the ejection amount of the dispenser is larger than that of the inkjet head, a larger line pattern can be formed than the line pattern formed by using the inkjet head.

It is desirable that the pattern formation material contained in the liquid material is particles of a metal, microparticles of an oxide of the metal, or microparticles of an alloy of the metal. Further, gold, silver, copper, platinum, nickel, palladium, tin or the like may be used as the metal. Further, it is desirable that the particle diameters of the metal, the oxide of the metal, and the alloy of the metal are less than or equal to 10 nm.

When the pattern formation material contained in the liquid material is particles of the metal, microparticles of an oxide of the metal, or microparticles of an alloy of the metal, electrical conductivity is achieved by heating/firing the pattern formation material.

In the present embodiment, the pattern formation material contained in the liquid material may be other kinds of electrically conductive material, such as an electrical conductive polymer material (high-polymer material, high molecular material or the like).

For example, NSP-J (product name), which is produced by Harima Chemicals, Inc., may be used as the liquid material containing the pattern formation material dispersed or dissolved therein.

As the dispersion solvent or solvent in which the pattern formation material is dispersed or dissolved, the following materials may be used, for example:

water, alcohols, such as methyl alcohol, ethyl alcohol, propyl alcohol, and butyl alcohol, hydrocarbon-based compounds, such as n-heptane, n-octane, decane, tetradecane, toluene, xylene, cymene, durene, indene, dipentene, tetrahydronaphthalene, decahydronaphthalene, and cyclohexylbenzene, ether-based compounds, such as ethylene glycol dimethyl ether, ethylene glycol diethyl ether, ethylene glycol methyl ethyl ether, diethylene glycol dimethyl ether, diethylene glycol diethyl ether, diethylene glycol methyl ethyl ether, 1,2-dimethoxyethane, bis(2-methoxyethyl)ether, and p-dioxane, or polar compounds, such as propylene carbonate, γ-butyrolactone, N-methyl-2-pyrrolidone, dimethylformamide, dimethylsulfoxide, and cyclohexane. Among these materials, water, alcohols, hydrocarbon-based compounds, and ether-based compounds are desirable, because they can achieve higher microparticle-dispersion characteristics, higher stability of the dispersion liquid (solution), and easy applicability to liquid droplet ejection methods. Water and hydrocarbon-based compounds are more desirable. These dispersion solvents or solvents may be used alone or in combination.

Meanwhile, the dot pitch of the liquid material is described in "The Impact and Spreading of Ink Jet Printed Droplets, J. Stringer and B. Derby, Digital Fabrication, pp. 128-130, 2006", for example. The dot pitch should be determined so that jaggy are not generated. Specifically, when the dot pitch is p, the diameter of the liquid material that has been ejected from the ejection unit 18 but has not deposited on the substrate 30 is d, the diameter of the liquid material in equilibrium after being deposited on the substrate 30 is $d_{eqm}$, $\beta_{eqm}=d_{eqm}/d$, a contact angle between the substrate 30 and the liquid material is θ, the dot pitch p is determined so that the dot pitch p is less than or equal to a jaggy generation limit, represented by the following equation (1):

$$p \leq \frac{2\pi d}{3\beta_{eqm}^2 \left(\frac{\theta}{\sin^2\theta} - \frac{\cos\theta}{\sin\theta}\right)} = \frac{\pi d}{6\left(\frac{\theta}{\sin^2\theta} - \frac{\cos\theta}{\sin\theta}\right)\left\{\tan\frac{\theta}{2}\left(3 + \tan^2\frac{\theta}{2}\right)\right\}^{-\frac{2}{3}}}. \quad (1)$$

The measurement unit 20 includes a laser measurement device, for example. The measurement unit 20 performs only the first step in advance, and measures the cross-sectional form of the dried body formed on the substrate 30 in the first step. Further, the measurement unit 20 outputs the result of measurement to the control unit 22. FIG. 2 is a diagram illustrating the cross-sectional form of the dried body formed on the substrate 30. In FIG. 2, the horizontal axis represents a distance in the width direction of the line pattern, and the vertical axis represents the height of the line pattern. As illustrated in FIG. 2, the line pattern formed on the substrate 30 in the first step has depressed cross-sectional form by coffee stain effect.

In the present embodiment, the ejection amount of the liquid material ejected in the second step is determined so that the depression (the cross-section of the depression) of the dried body is filled in the second step and the upper surface of the line pattern formed in the second step becomes even (flat). Therefore, the control unit 22 calculates the area S of the cross-section of the depression based on the cross-sectional form of the dried body. Since the relation "ejection amount/dot pitch p=area S of cross-section" exists, the ejection amount can be calculated by using the equation: ejection amount=dot pitch p×area S of cross-section. The dispersion liquid of the liquid material evaporates. Therefore, the ejection amount may be determined so that the ejection amount becomes larger than the value of "p×S" by the volume of the evaporating dispersion liquid.

In the present embodiment, a plate-form member made of various kinds of material, such as a glass substrate, a ceramic substrate, and a plastic substrate, may be used as the substrate 30.

The substrate 30 may be made of a flexible film material, which is a film material that can be bent. In such a case, various kinds of plastic films may be used as the substrate 30.

The plastic films are, for example, polyethylene terephthalate film, polybutylene terephthalate film, polycyclo-olefin film, biaxially stretch polypropylene film, polycarbonate film, polyamide film, polyvinyl chloride film, methacrylate-styrene resin film, polyimide film, silicon resin film, and fluoro-resin film.

Next, a line pattern formation method using the line pattern formation apparatus 10 will be described. FIGS. 3 through 7 are diagrams illustrating the steps of the line pattern formation method according to the first embodiment of the present invention in the order of processing. In FIGS. 3 through 7, only the substrate 30 is illustrated, and the structure of the line pattern formation apparatus 10 is omitted. In the present embodiment, metal-microparticle-dispersed ink 40 (hereinafter, referred to as ink 40), in which metal microparticles are dispersed in a solvent, is used as the liquid material, for example. Further, a circuit line pattern is formed by dropping the ink 40 from the ejection unit 18 onto the substrate 30, for example.

Figure 4:
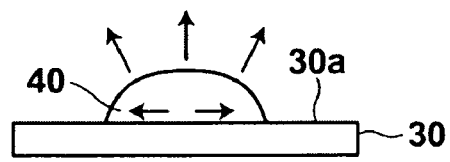
FIG. 4 is a diagram illustrating a step of the line pattern formation method according to the first embodiment of the present invention (No. 2)
Figure 5:
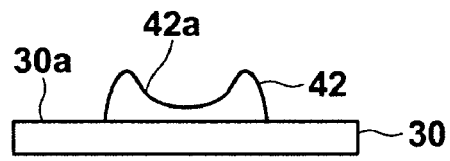
FIG. 5 is a diagram illustrating a step of the line pattern formation method according to the first embodiment of the present invention (No. 3)
Figure 8:
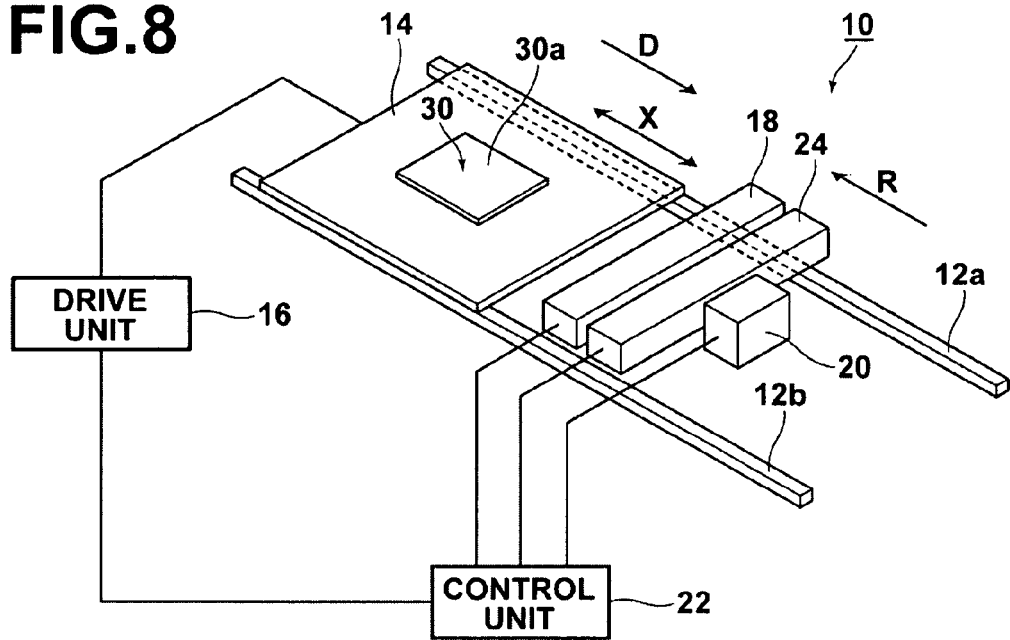
FIG. 8 is a schematic diagram illustrating a perspective view showing the structure of a modified example of the line pattern formation apparatus used in the line pattern formation method according to the first embodiment of the present invention.

First, in the first step, the stage 14 is moved by the drive unit 16 in the direction of arrow D, and the operation by the drive unit 16 is performed through the control unit 22. The stage 14 is moved relatively with respect to the ejection unit 18. While the relative position between the ejection unit 18 and the substrate 30 in the direction of arrow D is changed, the ink 40 is dropped from the ejection unit 18 onto the surface 30a of the substrate 30 in predetermined line pattern form, as illustrated in FIG. 3. At this time, the ink 40 that has been deposited on (or reached) the substrate 30 evaporates, as illustrated in FIG. 4. The ink 40 starts drying before the ink 40 spreads completely. Further, by coffee stain effect, a dried body 42 having depressed cross-sectional form is formed, as illustrated in FIG. 5. The method of drying may be an arbitrary method, such as natural drying and forced drying. In forced drying, for example, the substrate is heated, or warm or hot air is sent to the substrate 30. When the forced drying operation is performed, a heater 24 may be provided between the ejection unit 18 and the measurement unit 20, as illustrated in FIG. 8. The heater 24 heats the substrate 30, or blows hot air onto the substrate 30. The temperature and the amount of air sent from the heater 24 or the like may be controlled by the control unit 22. For example, the control unit 22 controls the heater 24 so that the temperature of the substrate 30 become 60° C. In the present embodiment, the state of the ink 40 may be semi-dried, in which some of the solvent of the ink 40 remains without being dried, as long as the depressed cross-sectional form can be maintained.

Figure 6:
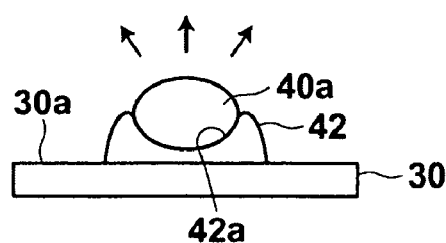
FIG. 6 is a diagram illustrating a step of the line pattern formation method according to the first embodiment of the present invention (No. 4)

Next, in the second step, the stage 14 is moved by the drive unit 16 in the direction of arrow R. In other words, the stage 14 is moved toward the ejection-unit-18 side. While the relative position between the ejection unit 18 and the substrate 30 with respect to the direction of arrow R is changed, ink 40a is dropped onto the same position as the position of the line pattern formed with the ink 40 on the substrate. In other words, the ink 40a is dropped into a depression 42a on the dried body 42, illustrated in FIG. 5. Accordingly, the depression 42a is filled with the ink 40a, as illustrated in FIG. 6.

Figure 7:
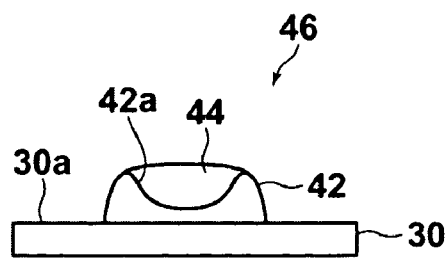
FIG. 7 is a diagram illustrating a step of the line pattern formation method according to the first embodiment of the present invention (No. 5)

At this time, the ejection amount of the ink 40a is determined in such a manner that the ejection amount of the ink 40a is smaller than the ejection amount of the ink 40 and the upper surface of the line pattern becomes even (flat). Therefore, when the ink 40a dries, a dried body 44 that has a flat upper surface is formed, as illustrated in FIG. 7. According to the present embodiment, a circuit pattern having a circuit portion 46 that is thin, and that has even thickness and cross-sectional form that is close to a rectangle can be formed.

In the first embodiment, the conveyance direction of the substrate 30 in the first step and the conveyance direction of the substrate 30 in the second step are opposite to each other. Therefore, after the first step, the control unit 22 reverses the ejection pattern of the ink 40 to perform the second step.

Next, after the line pattern is formed, the pattern is heated/fired for a predetermined time period to make particles bond together by fusion. Accordingly, electrically conductivity is provided to the line pattern. Consequently, a circuit pattern that is thin, and that has even thickness and cross-sectional form that is close to a rectangle is formed.

As described above, in the first embodiment, the ejection amount of the liquid material in the second step is lower than the ejection amount of the liquid material in the first step. Therefore, a line pattern that is thin, and that has cross-sectional form with even thickness can be formed. Hence, when the circuit pattern is formed by using the method or apparatus of the present embodiment, high-density wiring is possible. Further, since the thickness of the circuit pattern is even, the density of electric current becomes even, and the risk of disconnection of circuits is reduced.

Further, when the area of the cross-section of the depression 42a formed on the dried body 42 obtained by the first step is measured, and the ejection amount of the liquid material in the second step is determined based on the area of the cross-section, it is possible to form the line pattern that has a flat upper surface.

Further, when the dot pitch of the liquid material in the first step and in the second step is determined so that the dot pitch becomes less than or equal to the jaggy generation limit, represented by the above equation (1), it is possible to form a line pattern without jaggy. Hence, when the circuit pattern is formed in such a manner, the risk of disconnection of circuits can be further reduced.

Figure 9:
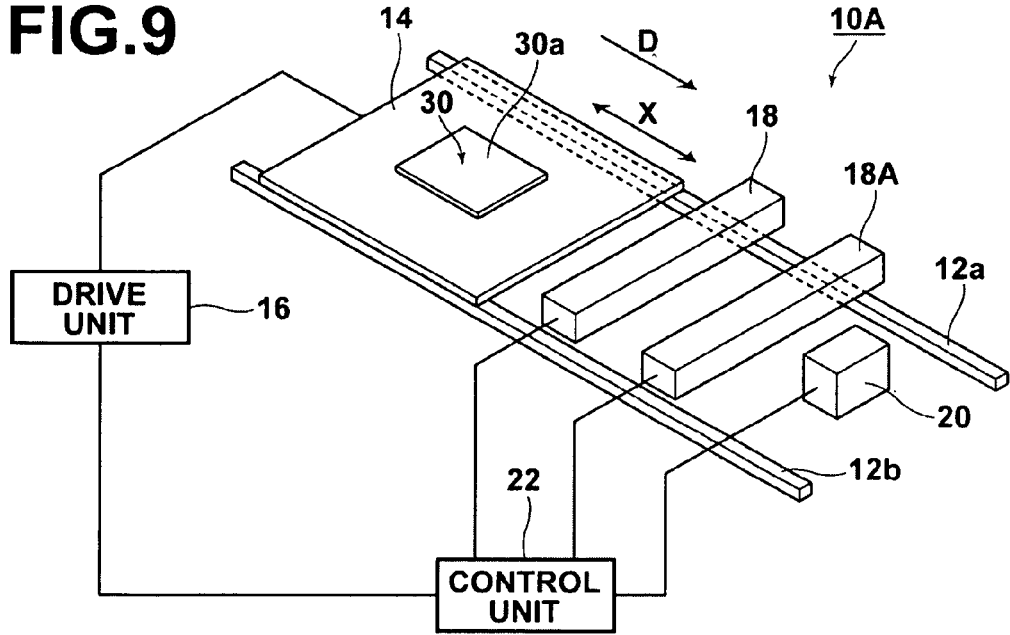
FIG. 9 is a schematic diagram illustrating a perspective view showing the structure of a line pattern formation apparatus used in a line pattern formation method according to a second embodiment of the present invention.

Next, the second embodiment of the present invention will be described. FIG. 9 is a schematic diagram illustrating a perspective view showing the structure of a line pattern formation apparatus used in a line pattern formation method according to the second embodiment of the present invention. In FIG. 9, the same reference numerals are assigned to the same elements as those illustrated in FIG. 1, and detailed descriptions of such elements are omitted. A line pattern formation apparatus 10A according to the second embodiment differs from the line pattern formation apparatus 10 according to the first embodiment in that the line pattern formation apparatus 10A includes two ejection units 18, 18A. It is desirable that the ranges of the ejection amounts of the two ejection units 18, 18A, which can be ejected by the ejection units 18, 18A, are different from each other. For example, two ejection units that have ejection nozzles having different diameters from each other may be used.

The ejection unit 18A has the same structure as the structure of the ejection unit 18. In the line pattern formation apparatus 10A of the second embodiment, while the substrate 30 is moved in the direction of arrow D, the ink 40 is dropped from the ejection unit 18 onto the substrate 30 in the first step. Next, in the second step, the ink 40a is dropped from the ejection unit 18A onto the dried body 42 formed on the substrate 30. In the second step, the ink 40a is dropped, at an ejection amount that has been determined, in a manner similar to the first step. Accordingly, a circuit pattern is formed.

In the line pattern formation apparatus 10A according the second embodiment, a circuit pattern having a circuit portion 46 that is thin, and that has cross-sectional form with even thickness can be formed by performing the steps illustrated in FIGS. 3 through 7 in a manner similar to the line pattern formation apparatus 10 of the first embodiment.

In the second embodiment, the substrate 30 is moved only in the direction of arrow D. Therefore, the ejection pattern of the ink 40 by the ejection unit 18 in the first step and the ejection pattern of the ink 40a by the ejection unit 18A in the second step are the same. Hence, unlike in the line pattern formation apparatus 10, after the first step, the control unit 22 does not need to reverse the ejection pattern of the ink 40 used in the first ejection to generate an ejection pattern for the second step.

Figure 10:
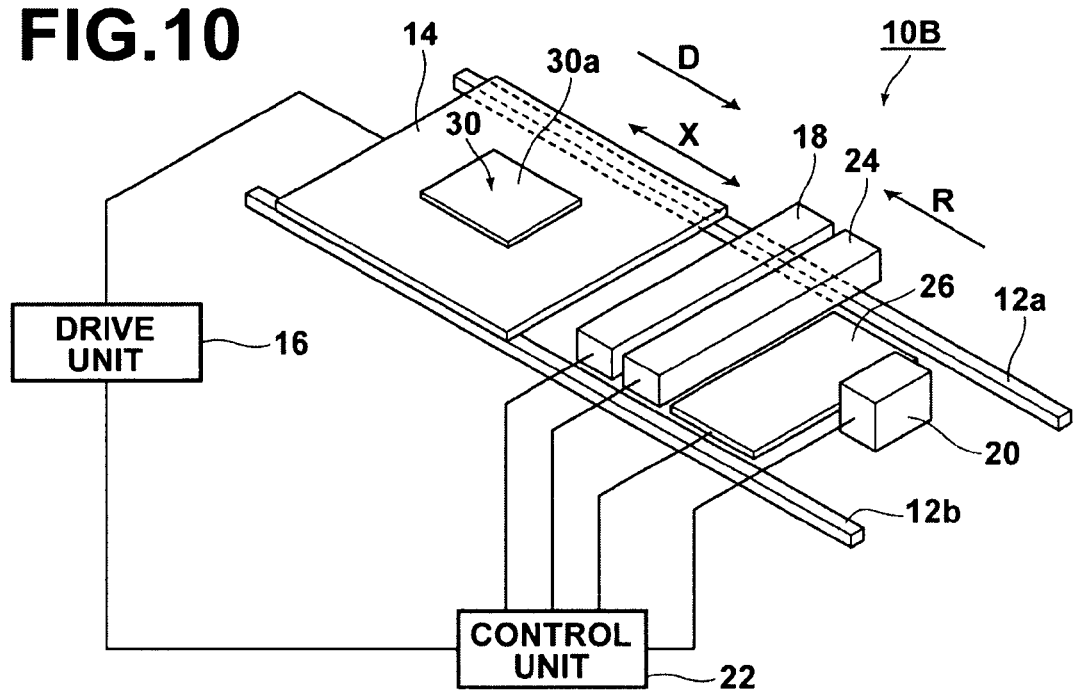
FIG. 10 is a schematic diagram illustrating a perspective view showing the structure of a line pattern formation apparatus used in a line pattern formation method according to a third embodiment of the present invention.

Next, a third embodiment of the present invention will be described. FIG. 10 is a schematic diagram illustrating a perspective view showing the structure of a line pattern formation apparatus according to the third embodiment of the present invention. In FIG. 10, the same reference numerals are assigned to the same elements as those illustrated in FIG. 1, and detailed descriptions of such elements are omitted. A line pattern formation apparatus 10B according to the third embodiment differs from the apparatus according to the first embodiment in that the line pattern formation apparatus 10B includes a cooling unit 26. The cooling unit 26 cools the substrate 30 in the second step to prevent the ink 40a ejected into the depression 42a of the dried body 42 from drying. In the third embodiment, the heater 24 is also provided. The cooling unit 26 is provided between the guides 12a and 12b in such a manner to be spaced from the heater 24 in direction X.

In the second step, the cooling unit 26 cools the substrate 30 to lower the temperature of the ink 40a to a predetermined temperature, for example, to room temperature or the like. When the temperature of the ink 40a becomes lower, evaporation of the ink 40a ejected into the depression 42a of the dried body 42 is suppressed. In other words, drying of the ink 40a is suppressed. For example, the cooling unit 26 includes a Peltier device, a cooling fan, or the like. The cooling unit 26 is connected to the control unit 22, and the temperature of the cooling unit 26 is controlled by the control unit 22. Further, when the cooling unit 26 includes a cooling fan, the number of rotation of the cooling fan or the like is controlled by the control unit 22. The stage 14 is arranged on the cooling unit 26, and the substrate 30 is cooled down to a predetermined temperature together with the stage 14, and maintained at the temperature.

In the line pattern formation apparatus 10B according the third embodiment, the circuit patterns are formed also by performing the steps illustrated in FIGS. 3 through 7 in a manner similar to the operation by the line pattern formation apparatus 10 of the first embodiment. In the third embodiment, after the dried body 42 as illustrated in FIG. 5 is formed, the substrate 30 is cooled by the cooling unit 26. After then, the stage 14 is moved toward the ejection unit 18, and the ink 40a is dropped into the depression 42a in the dried body 42. Accordingly, the depression 42a is filled with the ink 40a, as illustrated in FIG. 6. At this time, the substrate 30 has been cooled in the third embodiment. Therefore, the evapolation amount of the ink 40a is small, and the possibility of occurrence of coffee stain phenomenon is lower. Even when the ink 40a is dried, a depression is not formed in the depression 42a. Hence, it is possible form a dried body 44 that fills the depression 42a in the dried body 42, as illustrated in FIG. 7.

In the third embodiment, the temperature of the substrate 30 is lowered before the second ejection of the ink 40a (the second step) to prevent drying of the ink 40a. Alternatively, the humidity in the vicinity of the substrate 30 may be increased to increase the humidity of the dried body 42, instead of lowering the temperature of the substrate 30 by the cooling unit 26. In such a case, vapor obtained by evaporating the dispersion medium component of the ink 40a may be ejected from a humidifying apparatus.

In the line pattern formation apparatus 10A of the second embodiment, the cooling unit 26 may be provided. In such a case, the cooling unit 26 should be provided between the ejection unit 18 and the ejection unit 18A.

In the first through third embodiments, the measurement unit 20 measures the cross-sectional form of the dried body 42 formed in the first step in advance to determine the ejection amount of the liquid in the second step. Alternatively, after the first step, the measurement unit 20 may measure the cross-sectional form of the dried body 42, and determine the ejection amount for the second step. Further, the second step may be performed at the determined ejection amount. Accordingly, the ejection amount is determined so that the ejection amount is appropriate for a line pattern that is actually formed. Therefore, it is possible to make the upper surface of the line pattern precisely flat.

Further, the line pattern formation methods according to the first through third embodiments may be used, for example, to form a circuit pattern of a device.

In the embodiments of the present invention, the device is, for example, an image display device, such as a liquid crystal display device, an organic EL (electroluminescence) display device, and a plasma display device, a printed circuit board, an antenna circuit, or the like. However, the device is not limited to such devices.

Further, the electronic apparatus including such a device is, for example, a television set, a personal computer, a mobile phone, an RFID (radio frequency identification) apparatus, or the like. However, the electronic apparatus is not limited to such apparatuses.

The line pattern formation methods, device and electronic apparatus according to the present invention have been described in detail. The present invention is not limited to the above embodiments, and it is needless to say that various improvements and modifications are possible without deviating from the scope of the present invention.

What is claimed is:

1. A line pattern formation method comprising:
a first step in which a liquid material containing a pattern formation material dispersed or dissolved therein is dropped onto a substrate and dried; and
a second step in which the liquid material is dropped onto a dried body that has been obtained by drying the liquid material in the first step, wherein in the second step, the liquid material is dropped at a smaller ejection amount than that of the first step, wherein the pitch of dropping the liquid material onto the substrate in the first step and the pitch of dropping the liquid material onto the dried body in the second step are less than or equal to a jaggy generation limit, and wherein the ejection amount of the liquid material in the second step is determined based on the area of a cross section of a depression formed on the dried body.

2. A line pattern formation method, as defined in claim 1, wherein in the first step, the liquid material dropped onto the substrate is forcedly dried.

3. A line pattern formation method, as defined in claim 1, wherein in the second step, drying of the liquid material that has been dropped onto the dried body is suppressed.

4. A line pattern formation method, as defined in claim 1, wherein the liquid material is ejected by the same ejection means in the first and second steps.

5. A line pattern formation method, as defined in claim 1, wherein the liquid material is ejected by a different ejection means in each of the first and second steps.

6. A line pattern formation method, as defined in claim 1, wherein the liquid material is ejected by an ejection means of inkjet type or dispenser type.

7. A line pattern formation method, as defined in claim 1, wherein the pattern formation material is microparticles of a metal, microparticles of an oxide of the metal, or microparticles of an alloy of the metal.

8. A line pattern formation method, as defined in claim 7, wherein the metal is gold, silver, copper, platinum, nickel, palladium or tin.

9. A device comprising:
a portion formed by using a line pattern formation method comprising:
 a first step in which a liquid material containing a pattern formation material dispersed or dissolved therein is dropped onto a substrate and dried; and
 a second step in which the liquid material is dropped onto a dried body that has been obtained by drying the liquid material in the first step, wherein in the second step, the liquid material is dropped at a smaller ejection amount than that of the first step, wherein the pitch of dropping the liquid material onto the substrate in the first step and the pitch of dropping the liquid material onto the dried body in the second step are less than or equal to a jaggy generation limit, and wherein the ejection amount of the liquid material in the second step is determined based on the area of a cross section of a depression formed on the dried body.

10. An electronic apparatus comprising:
a device having a portion formed by using a line pattern formation method comprising:
 a first step in which a liquid material containing a pattern formation material dispersed or dissolved therein is dropped onto a substrate and dried; and
 a second step in which the liquid material is dropped onto a dried body that has been obtained by drying the liquid material in the first step, wherein in the second step, the liquid material is dropped at a smaller ejection amount than that of the first step, wherein the pitch of dropping the liquid material onto the substrate in the first step and the pitch of dropping the liquid material onto the dried body in the second step are less than or equal to a jaggy generation limit, and wherein the ejection amount of the liquid material in the second step is determined based on the area of a cross section of a depression formed on the dried body.

* * * * *